(12) United States Patent
Lai et al.

(10) Patent No.: US 8,877,100 B2
(45) Date of Patent: Nov. 4, 2014

(54) PASTE COMPOSITION AND SOLAR CELL ELEMENT USING THE SAME

(75) Inventors: Gaochao Lai, Osaka (JP); Takashi Watsuji, Osaka (JP); Haruzo Katoh, Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 758 days.

(21) Appl. No.: 11/990,618

(22) PCT Filed: Sep. 22, 2006

(86) PCT No.: PCT/JP2006/318816
§ 371 (c)(1),
(2), (4) Date: Feb. 19, 2008

(87) PCT Pub. No.: WO2007/046214
PCT Pub. Date: Apr. 26, 2007

(65) Prior Publication Data
US 2009/0223563 A1    Sep. 10, 2009

(30) Foreign Application Priority Data
Oct. 20, 2005  (JP) .................................. 2005-306025

(51) Int. Cl.
| | | |
|---|---|---|
| *H01B 1/02* | (2006.01) | |
| *H01B 1/22* | (2006.01) | |
| *C03C 8/04* | (2006.01) | |
| *C03C 8/18* | (2006.01) | |
| *H01L 31/0224* | (2006.01) | |
| *C03C 8/16* | (2006.01) | |
| *C03C 8/14* | (2006.01) | |

(52) U.S. Cl.
CPC .......... *H01L 31/022425* (2013.01); *C03C 8/04* (2013.01); *C03C 8/18* (2013.01); *H01B 1/22* (2013.01); *Y02E 10/52* (2013.01); *C03C 8/16* (2013.01); *C03C 8/14* (2013.01)
USPC ..................... 252/518.1; 361/526; 429/218.1; 136/261

(58) Field of Classification Search
USPC ......................................................... 524/437
See application file for complete search history.

(56) References Cited

U.S. PATENT DOCUMENTS

| | | | | |
|---|---|---|---|---|
| 5,616,956 A | * | 4/1997 | Horiguchi et al. | ............ 257/703 |
| 2004/0003836 A1 | * | 1/2004 | Watsuji et al. | ................ 136/243 |

FOREIGN PATENT DOCUMENTS

| | | | | |
|---|---|---|---|---|
| EP | 1400987 A2 | 3/2004 | | |
| JP | 61-93505 A | 5/1986 | | |
| JP | 62-237605 A | 10/1987 | | |
| JP | 01-118580 A | 5/1989 | | |
| JP | 03-116608 A | 5/1991 | | |
| JP | 03-209702 A | 9/1991 | | |
| JP | 04-198359 A | 7/1992 | | |
| JP | 05-129640 A | 5/1993 | | |
| JP | 2000-090734 A | 3/2000 | | |
| JP | 2004-134775 A | 4/2004 | | |
| JP | 2004134775 A | * 4/2004 | ............. | H01L 31/04 |
| JP | 2004-330247 A | 11/2004 | | |
| JP | 2004-355862 A | 12/2004 | | |
| JP | 2004355862 A | * 12/2004 | ............... | H01B 1/22 |
| JP | 2005-191107 A | 7/2005 | | |
| JP | 2005-200585 A | 7/2005 | | |
| WO | WO 2004097870 A1 | * 11/2004 | ............. | H01G 9/052 |

OTHER PUBLICATIONS

Database WPI Week 2005-545284, Thomson Scientific, London, GB, XP002554849.
Database WPI Week 2005-015883, Thomson Scientific, London, GB, XP002554850.

* cited by examiner

*Primary Examiner* — Robert C Boyle
(74) *Attorney, Agent, or Firm* — Birch, Stewart, Kolasch & Birch, LLP

(57) ABSTRACT

A paste composition for forming an electrode on a silicon semiconductor substrate, the paste containing aluminum powder; an organic vehicle and a hydroxide. The paste composition finds applicability in a solar cell element wherein the electrode is formed by applying the paste on the silicon semiconductor substrate and thereafter, firing the paste composition.

12 Claims, 1 Drawing Sheet

PASTE COMPOSITION AND SOLAR CELL ELEMENT USING THE SAME

TECHNICAL FIELD

The present invention relates generally to paste compositions and solar cell elements using the same. More particularly, the present invention relates to a paste composition, which is used when an electrode is formed on a silicon semiconductor substrate constituting a crystalline silicon solar cell, and to a solar cell element using the same.

BACKGROUND ART

As an electronic component having an electrode formed on a silicon semiconductor substrate, solar cell elements disclosed in Japanese Patent Application Laid-Open Publication No. 2000-90734 (Patent Document 1) and Japanese Patent Application Laid-Open Publication No. 2004-134775 (Patent Document 2) have been known.

FIG. 1 is a schematic view showing a general sectional structure of a solar cell element.

As shown in FIG. 1, the solar cell element is structured in general by using a p-type silicon semiconductor substrate 1 whose thickness is 220 to 300 μm. On a light receiving surface of the silicon semiconductor substrate 1, an n-type impurity layer 2 whose thickness is 0.3 to 0.6 μm, and an antireflection film 3 and grid electrodes 4, which are on the n-type impurity layer 2, are formed.

On a back surface of the p-type silicon semiconductor substrate 1, an aluminum electrode layer 5 is formed. The formation of the aluminum electrode layer 5 is conducted through applying an aluminum paste composition containing aluminum powder, a glass frit, and an organic vehicle by employing screen printing or the like; drying; and thereafter, firing the aluminum paste composition for a short period of time at a temperature greater than or equal to 660° C. (melting point of aluminum). During the firing, the aluminum is diffused inside of the p-type silicon semiconductor substrate 1, whereby an Al—Si alloy layer 6 is formed between the aluminum electrode layer 5 and the p-type silicon semiconductor substrate 1 and concurrently, a p+ layer 7 is formed as an impurity layer resulting from diffusion of aluminum atoms. The presence of the p+ layer 7 prevents recombination of electrons, and therefore a BSF (Back Surface Field) effect which enhances a collection efficiency of generated carriers can be obtained.

For example, as disclosed in Japanese Patent Application Laid-Open Publication No. 5-129640 (Patent Document 3), a solar cell element in which a back surface electrode 8 including an aluminum electrode layer 5 and an Al—Si alloy layer 6 is removed by using acid or the like and a collecting electrode layer is newly formed by using a silver paste or the like has been put into practical use. However, since disposal of the acid used for removing the back surface electrode 8 is required, for example, a problem that the disposal makes a process complicated accrues. In recent years, in order to avoid such a problem, many solar cell elements have been structured with the back surface electrode 8 left as it is and utilized as a collecting electrode.

In the meantime, in order to reduce costs in manufacturing solar cells, making a silicon semiconductor substrate thinner has been examined these days. However, when the silicon semiconductor substrate is thinner, after firing the aluminum paste composition, a back surface having a back surface electrode layer formed thereon is deformed in a concave manner due to a difference between thermal expansion coefficients of silicon and aluminum, thereby deforming and bowing the silicon semiconductor substrate. If the bow occurs, a fracture or the like in the silicon semiconductor substrate is easily caused in a process of manufacturing a solar cell. On the other hand, as a method for inhibiting occurrence of the bow, there is a method in which an applying amount of the aluminum paste composition is decreased and the back surface electrode layer is made thinner. However, when the applying amount of the aluminum paste composition is decreased, blisters and globules of the aluminum are easily formed during the firing. Stresses concentrate on portions of the formed blisters and the formed globules of the aluminum, thereby causing a fracture in the silicon semiconductor substrate. As a result, there has been a problem that manufacturing yields of the solar cells are reduced.

In order to solve the above-mentioned problems, a variety of aluminum paste compositions have been proposed.

Japanese Patent Application Laid-Open Publication No. 2004-134775 (Patent Document 2) discloses, as an electrically conductive paste which is capable of reducing contraction of an electrode film caused during the firing and of inhibiting bow of an Si wafer, an aluminum paste composition which includes aluminum powder, a glass frit, and an organic vehicle, the organic vehicle containing particles which have low solubility or irresolvability, the particles being at least one kind of organic compound particles and carbon particles.

In addition, Japanese Patent Application Laid-Open Publication No. 2005-191107 (Patent Document 4) discloses a method for manufacturing a solar cell element, which attains a high performance back surface electrode in which formation of globules and protrusions of aluminum and blistering of the electrode are inhibited and achieves high productivity by reducing bow of a semiconductor substrate. In an aluminum paste used in the disclosed method, aluminum powder of which mean particle size $D_{50}$ in cumulative particle size distribution on a volume basis is 6 to 20 μm and in which particles each having a particle size less than or equal to a half of the mean particle size $D_{50}$ account for 15% or less of all particles in the particle size distribution is contained.

However, even when these aluminum pastes were used, it was impossible to inhibit formation of blisters and globules of aluminum in the back surface electrode layer, caused during the firing, and to inhibit deformation of a semiconductor substrate, caused after the firing.

[Patent Document 1] Japanese Patent Application Laid-Open Publication No. 2000-90734

[Patent Document 2] Japanese Patent Application Laid-Open Publication No. 2004-134775

[Patent Document 3] Japanese Patent Application Laid-Open Publication No. 5-129640

[Patent Document 4] Japanese Patent Application Laid-Open Publication No. 2005-191107

DISCLOSURE OF THE INVENTION

Problems to be Solved by the Invention

Therefore, in order to solve the above-mentioned problems, objects of the present invention are to provide a paste composition which is capable of inhibiting the formation of blisters and globules of aluminum in a back surface electrode layer, caused during the firing, and of reducing the deformation of a silicon semiconductor substrate; and to provide a solar cell element comprising an electrode which is formed by using the composition.

Means for Solving the Problems

In order to solve the problems of the conventional art, the inventors have devoted themselves to studies. As a result, the inventors found that the above-mentioned objects can be achieved by using a paste composition having specific composition. Based on the findings, the paste composition according to the present invention has the following features.

The paste composition according to the present invention is used for forming an electrode on a silicon semiconductor substrate and contains aluminum powder, an organic vehicle, and a hydroxide.

It is preferable that the hydroxide contained in the paste composition of the present invention is one kind selected from the group consisting of an aluminum hydroxide, a magnesium hydroxide, a calcium hydroxide, a strontium hydroxide, and a barium hydroxide.

Further, it is preferable that the paste composition of the present invention contains the hydroxide of greater than or equal to 0.1% by mass and less than or equal to 25.0% by mass.

It is preferable that the paste composition of the present invention further contains a glass frit.

The solar cell element according to the present invention comprises an electrode which is formed by applying on a silicon semiconductor substrate the paste composition having any of the above-mentioned features and thereafter, by firing the paste composition.

Effect of the Invention

As described above, according to the present invention, by using a paste composition further containing a hydroxide in addition to aluminum powder and an organic vehicle, formation of blisters and globules of aluminum in an aluminum electrode layer which is formed on a back surface of a silicon semiconductor substrate can be inhibited; deformation of the silicon semiconductor substrate can be reduced; and yields of manufacturing solar cell elements can be improved.

EXPLANATION OF REFERENCE NUMERALS

Figure 1:
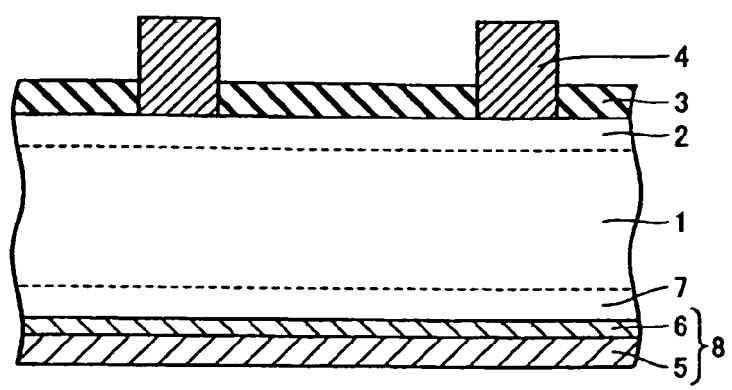
FIG. 1 is a schematic view showing a general sectional structure of a solar cell element to which the present invention is applied as one embodiment.

1: p-type silicon semiconductor substrate, 2: n-type impurity layer, 3: antireflection film, 4: grid electrode, 5: aluminum electrode layer, 6: Al—Si alloy layer, 7: p+ layer, 8: back surface electrode.

BEST MODE FOR CARRYING OUT THE INVENTION

A paste composition of the present invention contains an hydroxide in addition to aluminum powder and an organic vehicle. In a case where a paste having the conventional composition is used, reaction of aluminum and silicon and sintering of aluminum cannot be controlled. As a result, a produced amount of an Al—Si alloy is locally increased, thereby causing phenomena such as formation of blisters and globules of aluminum and an increase in deformation of a silicon semiconductor substrate due to excessive sintering of aluminum. In the present invention, by containing the hydroxide in the paste, the reaction of aluminum and silicon and the sintering of aluminum can be controlled so as to avoid excessive advancing of the reaction and the sintering. In the hydroxide contained in the paste, a dehydration decomposition reaction occurs at a temperature of 200 to 500° C. during the firing. It is considered that owing to an endothermic reaction which results from this dehydration decomposition and to surface oxidation of aluminum powder, which is caused by decomposed water vapor, the formation of blisters and globules of aluminum and the deformation of a silicon semiconductor substrate can be inhibited.

The hydroxide contained in the paste composition of the present invention is not particularly limited and it is only required for the hydroxide to be capable of obtaining an effect of the present invention. For example, hydroxides which each contain a metallic element such as copper and iron are cited. It is only required for a preferable hydroxide to be at least one kind selected from the group consisting of hydroxides of elements in family IIa and hydroxides of elements in family IIIb in a periodic table. More specifically, the hydroxide is one kind selected from the group consisting of an aluminum hydroxide, a magnesium hydroxide, a calcium hydroxide, a strontium hydroxide, and a barium hydroxide. The reason why the hydroxides of elements in the family IIa and the hydroxides of elements in the family IIIb in the periodic table are preferable is that even if the elements in the above-mentioned family IIa and family IIIb in the periodic table are diffused in the silicon semiconductor substrate during the firing of the paste composition of the present invention, a degree of inhibiting a BSF effect is small and an influence of a reduction in an energy conversion efficiency is also small.

It is preferable that a content of the hydroxide contained in the paste composition of the present invention is greater than or equal to 0.1% by mass and less than or equal to 25.0% by mass. If the content of the hydroxide is less than 0.1% by mass, it is likely that a desired effect of inhibiting the formation of blisters and globules of aluminum cannot be obtained, and a sufficient effect of inhibiting the deformation of the silicon semiconductor substrate by the firing cannot be attained by adding the hydroxide. If the content of the hydroxide exceeds 25.0% by mass, a surface resistance in the back surface electrode layer is increased, and thereby, an adverse effect that sintering of the paste is inhibited may accrue. If the surface resistance in the back surface electrode layer is increased, an ohmic resistance is increased and energy generated from irradiation of solar light cannot be effectively taken out, thereby incurring a reduction in an energy conversion efficiency. Through setting the content of the hydroxide to be in the above-mentioned range, the surface resistance can be controlled within the below-mentioned favorable range, a BSF effect and an electrode function of the aluminum electrode layer are not decreased, formation of blisters and globules of aluminum in the aluminum electrode layer is inhibited, and an amount of deformation of the silicon semiconductor substrate can be reduced.

It is preferable that a content of the aluminum powder contained in the aluminum paste composition of the present invention is greater than or equal to 50% by mass and less than or equal to 80% by mass. If the content of the aluminum powder is less than 50% by mass, a resistance of the aluminum electrode layer formed by the firing is increased, whereby an energy conversion efficiency of solar cells may be reduced. If the content of the aluminum powder exceeds 80% by mass, applying performance of the paste in screen printing or the like is degraded.

In the present invention, aluminum powder having a wide range of mean particle sizes of 1 to 20 μm can be used. In a case where the aluminum powder is blended in the paste composition, it is preferable to use aluminum powder having a mean particle size of 2 to 15 μm and more preferable to use aluminum powder having a mean particle size of 3 to 10 μm. If the mean particle size is less than 1 μm, a specific surface area of the aluminum powder is large, which is undesirable. If the mean particle size exceeds 20 μm, an appropriate viscosity of the paste composition having the aluminum powder contained therein cannot be obtained, which is undesirable. A shape and a manufacturing method of the powder of the aluminum powder contained in the paste composition of the present invention are not particularly limited.

Although the organic vehicle contained in the paste composition of the present invention is not particularly limited, a resin such as an ethyl cellulose resin and an alkyd resin and solvents such as a glycol ether based compound and a terpineol based compound can be used. It is preferable that a content of the organic vehicle is greater than or equal to 15% by mass and less than or equal to 40% by mass. If the content of the organic vehicle is less than 15% by mass, printing performance of the paste is degraded and a favorable aluminum electrode layer cannot be formed. If the content of the organic vehicle exceeds 40% by mass, not only a viscosity of the paste is increased but also a problem that firing of the aluminum is hampered due to excessive presence of the organic vehicle accrues.

Furthermore, the paste composition of the present invention may contain a glass frit. Although the content of the glass frit contained in the paste composition of the present invention is not particularly limited, it is preferable that the content of the glass frit is less than or equal to 8% by mass. If the content of the glass frit exceeds 8% by mass, segregation of glass may arise, a resistance of the aluminum electrode layer may be increased, and a power generation efficiency of a solar cell may be reduced. Although a lower limit of the content of the glass frit is not particularly limited, the lower limit of the content of the glass frit in general is greater than or equal to 0.1% by mass.

Although composition of the glass frit contained in the paste composition of the present invention is not particularly limited, glass based composition whose chief ingredients are at least two kinds of oxides selected from the group consisting of PbO, $B_2O_3$, ZnO, $Bi_2O_3$, $SiO_2$, $Al_2O_3$, MgO, and BaO is cited in general.

Although a mean particle size of the glass frit contained in the paste composition of the present invention is not particularly limited, it is preferable that the mean particle size is less than or equal to 20 μm.

In the paste composition of the present invention, a variety of additives, such as a dispersant, a plasticizer, an anti-settling agent, a thixo-agent, etc., which adjust properties of a paste as necessary can be used. Although composition of the additives is not particularly limited, it is preferable that a content thereof is less than or equal to 10% by mass.

EXAMPLES

Hereinunder, one example of the present invention will be described.

First, a variety of paste compositions which each contain aluminum powder of 50 to 80% by mass, a glass frit of 0.1 to 8% by mass, an organic vehicle, having ethyl cellulose dissolved in a glycol ether based organic solvent, of a range of 15 to 40% by mass, and also each contain a hydroxide at a percentage shown in Table 1 were prepared.

Specifically, paste compositions (Examples 1 to 18) were prepared through adding aluminum powder and ZnO—$B_2O_3$—$SiO_2$ based glass frits to organic vehicles having ethyl cellulose dissolved in glycol ether based organic solvents and further adding thereto a variety of hydroxides in added amounts shown in Table 1 and through blending them by using a well-known mixer. In addition, by employing the same method as described above, as shown in Table 1, a conventional paste composition (Comparison Example 1) which contains no hydroxide was prepared.

Here, in consideration of securing reactivity of the aluminum powder with the silicon semiconductor substrate, applying performance of the aluminum powder, and uniformity of coating films, powder whose particles have mean particle sizes of 2 to 20 μm and have spherical shapes or near-spherical shapes was used. The glass frits whose particles have mean particle sizes of 1 to 12 μm were used.

The above-described variety of paste compositions were applied and printed on p-type silicon semiconductor substrates each having a thickness of 220 μm and dimensions of 155 mm×155 mm by using a 165-mesh screen printing plate of and were dried. An applying amount was set so as to be 1.5±0.1 g/substrate before drying.

After the p-type silicon semiconductor substrates having the pastes printed thereon were dried, the p-type silicon semiconductor substrates having the pastes printed thereon were fired under air atmosphere in an infrared continuous firing furnace. A temperature in a firing zone of the firing furnace was set to be 760° C. to 780° C. and a time period (firing time) during which the substrates remain in the firing furnace was set to be 8 to 12 seconds. After the firing, cooling was carried out, whereby a structure in which the aluminum electrode layer 5 and the Al—Si alloy layer 6 were formed in the p-type silicon semiconductor substrate 1 as shown in FIG. 1 was obtained.

In the aluminum electrode layer 5 formed on the silicon semiconductor substrate, the number of blisters and the number of globules of aluminum per measurement surface area 150×150 mm$^2$ were visually counted as amounts of formation thereof. A sum of the counted number of blisters and the counted number of globules of aluminum is each shown in Table 1. A target value of the sum thereof, which allows prevention of a fracture in the silicon semiconductor substrate in a manufacturing process, is supposed to be 10.

A surface resistance of the back surface electrode 8 which influences an ohmic resistance between electrodes was measured by using a 4-point probe surface resistance meter (RG-5-type sheet resistance meter produced by Napson corporation). Measuring conditions were: a voltage was 4 mV; a current was 100 mA, and a load applied on a surface of the back surface electrode 8 was 200 grf (1.96N). A measured value thereof is each shown in "Surface Resistance of Back Surface Electrode [mΩ/□(square)]" in Table 1.

Thereafter, the p-type silicon semiconductor substrate having the back surface electrode 8 formed thereon was immersed in a hydrochloric acid aqueous solution, whereby the aluminum electrode layer 5 and the Al—Si alloy layer 6 were removed through dissolving. A surface resistance of the p-type silicon semiconductor substrate having a p+ layer 7 formed thereon was each measured by using the above-mentioned surface resistance meter.

It is assumed that there is a correlation between a surface resistance of the p$^+$ layer 7 and a BSF effect and the smaller the surface resistance thereof is, the higher the BSF effect is.

Here, a preferable value of the surface resistance is less than or equal to 20 mΩ/□(square) in the back surface electrode 8 and less than or equal to 21Ω/□(square) in the p⁺ layer 7.

Figure 2:
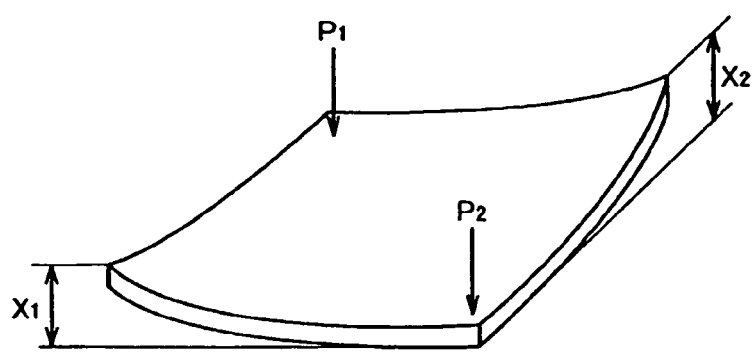
FIG. 2 is a schematic view showing a method for measuring an amount of deformation of a p-type silicon semiconductor substrate on which an aluminum electrode layer has been formed by firing.

A deformation amount of the p-type silicon semiconductor substrate having the aluminum electrode layer formed by the firing was each measured in the below-described manner. As shown in FIG. 2, after the firing and the cooling, two diagonal corners of four corners of the substrate with the aluminum electrode layer being thereon were pressed down as indicated by arrows $P_1$ and $P_2$ and uplift amounts $X_1$ and $X_2$ (each including a thickness of the substrate) of the other corners than the two diagonal corners were measured. In addition, by using the same method as described above, the portions at which the uplift amounts $X_1$ and $X_2$ were measured were pressed down in a manner as indicated by the arrows $P_1$ and $P_2$, and uplift amounts $X_3$ and $X_4$ of the two corners pressed down in the manner as indicated by the arrows $P_1$ and $P_2$ were measured. An average value of the uplift amounts $X_1$, $X_2$, $X_3$, and $X_4$ was calculated as a "Deformation Amount of Silicon Semiconductor Substrate [mm]". A target value of the deformation amount is less than or equal to 3.0 mm.

The surface resistance of the back surface electrode 8, the surface resistance of the p+ layer 7, the deformation amount of the silicon semiconductor substrate, which were measured in the above-described manner, are each shown in Table 1.

TABLE 1

| | Kind of Hydroxide | Added Amount of Hydroxide [% by mass] | Amount of Forming Blisters and Al Globules [piece(s)] | Surface Resistance of Back Surface Electrode [mΩ/□] | Surface Resistance of p⁺ Layer [Ω/□] | Deformation Amount of Silicon Semiconductor Substrate [mm] |
|---|---|---|---|---|---|---|
| Example 1 | Al(OH)₃ | 0.08 | 12 | 14.8 | 16.6 | 2.9 |
| Example 2 | Al(OH)₃ | 0.12 | 9 | 15.0 | 16.7 | 2.7 |
| Example 3 | Al(OH)₃ | 3.0 | 2 | 15.5 | 16.9 | 1.9 |
| Example 4 | Fe(OH)₃ | 3.0 | 2 | 15.1 | 16.4 | 1.9 |
| Example 5 | Cu(OH)₂ | 3.0 | 3 | 15.8 | 16.7 | 1.8 |
| Example 6 | Mg(OH)₂ | 3.0 | 2 | 15.3 | 16.7 | 1.8 |
| Example 7 | Ca(OH)₂ | 3.0 | 3 | 15.6 | 16.9 | 2.0 |
| Example 8 | Al(OH)₃ | 5.0 | 1 | 15.9 | 17.0 | 1.7 |
| Example 9 | Ca(OH)₂ | 5.0 | 1 | 16.0 | 16.9 | 1.5 |
| Example 10 | Al(OH)₃ | 9.0 | 0 | 16.8 | 17.2 | 1.5 |
| Example 11 | Ca(OH)₂ | 10.0 | 0 | 17.5 | 17.7 | 1.6 |
| Example 12 | Ca(OH)₂ Mg(OH)₂ | 5.0 5.0 | 0 | 17.2 | 17.8 | 1.5 |
| Example 13 | Al(OH)₃ | 11.0 | 0 | 18.5 | 19.3 | 1.4 |
| Example 14 | Mg(OH)₂ | 15.0 | 0 | 18.9 | 19.6 | 1.3 |
| Example 15 | Al(OH)₃ | 18.0 | 0 | 19.0 | 20.1 | 1.1 |
| Example 16 | Al(OH)₃ | 23.0 | 0 | 19.5 | 20.8 | 1.0 |
| Example 17 | Mg(OH)₂ | 23.0 | 0 | 19.8 | 20.5 | 1.1 |
| Example 18 | Mg(OH)₂ | 27.0 | 0 | 22.3 | 22.6 | 1.0 |
| Comparison Example 1 | — | — | 15 | 14.9 | 16.5 | 3.3 |

It is found from a result shown in Table 1 that by using the paste compositions (Examples 1 to 18) of the present invention, which each use the hydroxide, a reduction in an electrode function and in an BSF effect of the aluminum electrode layer can be avoided, formation of the blisters and the globules of aluminum in the aluminum electrode layer can be inhibited, and a deformation amount of the silicon semiconductor substrate can be reduced, when compared with the conventional paste composition (Comparison Example 1) which contains no hydroxide.

The described embodiment and examples are to be considered in all respects only as illustrative and not restrictive. It is intended that the scope of the invention is, therefore, indicated by the appended claims rather than the foregoing description of the embodiment and examples and that all modifications and variations coming within the meaning and equivalency range of the appended claims are embraced within their scope.

INDUSTRIAL APPLICABILITY

According to the present invention, by using a paste composition containing a hydroxide in addition to aluminum powder and an organic vehicle, formation of blisters and globules of aluminum in an aluminum electrode layer which is formed on a back surface of a silicon semiconductor substrate can be inhibited; deformation of the silicon semiconductor substrate can be reduced; and yields of manufacturing solar cell elements can be improved.

The invention claimed is:

1. A paste composition for forming an electrode on a silicon semiconductor substrate constituting a solar cell comprising:
    50 to 80% by mass of aluminum powder;
    15 to 40% by mass of an organic vehicle; and
    0.12 to 23% by mass of a hydroxide, selected from the group consisting of magnesium hydroxide, calcium hydroxide, strontium hydroxide and barium hydroxide.

2. The aluminum paste composition according to claim 1, further comprising a glass frit.

3. A solar cell element comprising an electrode formed by applying the paste composition according to claim 1 on a silicon semiconductor substrate and thereafter, firing the paste composition.

4. The paste composition of claim 1, wherein the aluminum powder has a particle size of 1 to 20 μm.

5. The paste composition of claim 4, wherein the organic vehicle is an alkyd resin or an ethyl cellulose resin.

6. The paste composition of claim 4, wherein the organic vehicle is a glycol ether solvent or a terpineol based compound.

7. The paste composition of claim 4, further containing from 0.1 up to 8% by mass of glass frit which includes at least two kinds of oxides selected from the group consisting of PbO, $B_2O_3$, ZnO, $Bi_2O_3$, $SiO_2$, $Al_2O_3$, MgO and BaO.

8. A solar cell comprising a fired composite of a paste composition forming electrode on a silicon semiconductor substrate, said paste having a composition which comprises:
- 50 to 80% by mass of aluminum powder,
- 0.12 to 23% by mass of a metal hydroxide, selected from the group consisting of magnesium hydroxide, calcium hydroxide, strontium hydroxide and barium hydroxide, and
- 15 to 40% by mass of an organic vehicle.

9. The solar cell of claim 8, wherein the aluminum powder has a particle size of 1 to 20 μm.

10. The solar cell of claim 8, wherein the organic vehicle is an alkyd resin or an ethyl cellulose resin.

11. The solar cell of claim 8, wherein the organic vehicle is a glycol ether solvent or a terpineol based compound.

12. The solar cell of claim 8, further containing from 0.1 up to 8% by mass of glass frit which includes at least two kinds of oxides selected from the group consisting of $PbO$, $B_2O_3$, $ZnO$, $Bi_2O_3$, $SiO_2$, $Al_2O_3$, $MgO$ and $BaO$.

* * * * *